(12) United States Patent
Ning et al.

(10) Patent No.: US 7,067,371 B2
(45) Date of Patent: Jun. 27, 2006

(54) SILICON-ON-INSULATOR (SOI) INTEGRATED CIRCUIT (IC) CHIP WITH THE SILICON LAYERS CONSISTING OF REGIONS OF DIFFERENT THICKNESS

(75) Inventors: Tak H. Ning, Yorktown Heights, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/900,523

(22) Filed: Jul. 28, 2004

(65) Prior Publication Data

US 2005/0006704 A1 Jan. 13, 2005

Related U.S. Application Data

(62) Division of application No. 10/280,661, filed on Oct. 25, 2002, now Pat. No. 6,835,983.

(51) Int. Cl.
*H01L 21/8249* (2006.01)
(52) U.S. Cl. ...................................... 438/234
(58) Field of Classification Search ................ 438/400, 438/403, 439, 758, 765, 769, 770, 309, 311, 438/353, 202, 234
See application file for complete search history.

(56) References Cited

U.S. PATENT DOCUMENTS

| | | | |
|---|---|---|---|
| 5,102,809 A | 4/1992 | Eklund | |
| 5,212,397 A | 5/1993 | See et al. | |
| 5,463,238 A | 10/1995 | Takahashi et al. | |
| 5,740,099 A | 4/1998 | Tanigawa | |
| 6,063,652 A | 5/2000 | Kim | |
| 6,229,179 B1 | 5/2001 | Song et al. | |
| 6,537,891 B1* | 3/2003 | Dennison et al. | 438/406 |
| 6,764,917 B1* | 7/2004 | Chan et al. | 438/406 |
| 2001/0008284 A1 | 7/2001 | Huang | |

* cited by examiner

*Primary Examiner*—Scott Geyer
(74) *Attorney, Agent, or Firm*—Scully, Scott, Murphy & Presser, P.C.; Robert M. Trepp, Esq.

(57) ABSTRACT

The present invention provides SOI material which includes a top Si-containing layer which has regions of different thickness as well as a method of fabricating such SOI material. The inventive method includes a step of thinning predetermined regions of the top Si-containing layer by masked oxidation of silicon. SOI IC chips including the inventive SOI material having different types of CMOS devices build thereon as also disclosed.

8 Claims, 7 Drawing Sheets

US 7,067,371 B2

SILICON-ON-INSULATOR (SOI) INTEGRATED CIRCUIT (IC) CHIP WITH THE SILICON LAYERS CONSISTING OF REGIONS OF DIFFERENT THICKNESS

RELATED APPLICATION

This application is a divisional of U.S. application Ser. No. 10/280,661, filed Oct. 25, 2002 now U.S. Pat. No. 6,835,983.

FIELD OF THE INVENTION

The present invention relates to semiconductor integrated circuit (IC) chips, and more particularly to a silicon-on-insulator (SOI) IC chip that comprises a top Si-containing layer (i.e., the SOI layer), in which Si devices are formed, that has regions of different thickness. Since the optimal silicon thickness for various SOI devices are different, the present invention enables silicon devices requiring different SOI silicon thickness to be integrated on the same chip.

BACKGROUND OF THE INVENTION

Conventional SOI IC chips, independent on how the SOI material is prepared, has one starting silicon thickness. The silicon thickness is determined by the specific silicon device to be built. For example, for so-called partially-depleted CMOS devices, the silicon layer thickness should be thick enough, typically on the order of about 100 to about 300 nm, such that there is always a non-depleted quasi-neutral silicon region left beneath the CMOS device channel region, or in the CMOS "device substrate". However, for so-called fully depleted CMOS devices, the silicon layer thickness should be thin enough, typically on the order of about 10 to about 150 nm, such that the "device substrate" beneath the gate region is normally depleted of mobile carriers and there is no quasi-neutral region left beneath the CMOS device channel region.

One serious limitation with conventional single-thickness SOI material is that it is not suitable for building several kinds of silicon devices, or silicon devices for different applications, on the same chip. For example, high-speed digital CMOS usually uses a relatively thin Si layer, while analog CMOS prefers a thicker. Si layer. In fact, for precision analog circuits, it is preferred to have the silicon layer thick enough to provide a convenient device substrate contact in order to avoid undesirable floating-body effects associated with SOI MOSFET devices without device substrate contact. Moreover, bipolar devices may require an even thicker silicon layer in order to accommodate the three vertical device regions, namely the emitter, the base and the collector.

In view of the above, there is a need for providing SOI IC chips in which the top Si-containing layer of the SOI wafer has regions of variable thickness. By providing regions of different thickness on the same Si layer, a SOI wafer suitable for integrating various types of silicon devices on the same SOI chip can be obtained. That is, it also permits "system on an SOI chip" to be realized.

SUMMARY OF THE INVENTION

The present invention provides SOI materials which comprise a top Si-containing layer (i.e., an SOI layer) which includes regions having variable thickness. Specifically, the inventive SOI material comprises:

a buried insulating region which is sandwiched between a bottom Si-containing layer and a top Si-containing layer, said top Si-containing layer comprises at least one region of a first thickness and at least one other region of a second thickness wherein said first thickness is different from said second thickness.

The present invention also provides various SOI integrated circuit chips which include at least the inventive SOI material on which various devices such as CMOS transistors and bipolar transistors are formed.

The present invention also relates to a method of fabricating the above mentioned SOI material. Specifically, the method of the present invention comprises the steps of:

providing a starting SOI wafer which comprises a buried insulating region sandwiched between a bottom Si-containing layer and a top Si-containing layer, said top Si-containing layer having a substantially uniform thickness; and thinning predetermined regions of the top Si-containing layer by masked oxidation of silicon.

DETAILED DESCRIPTION OF THE INVENTION

The present invention, which provides a method of forming a SOI material comprising a top Si-containing layer having regions of different silicon thickness, will now be described in more detail.

Figure 1A:
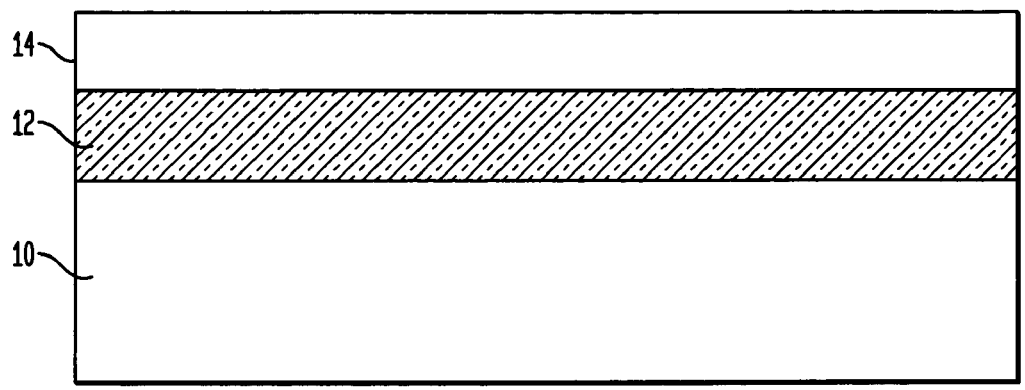
FIGS. 1A–1E are pictorial representations (through cross sectional views) illustrating the basic processing steps of the present invention which are used for forming a SOI material with variable silicon thickness.

Reference is first made to FIGS 1A–1E which illustrate the basic processing steps of the present invention which are employed in fabricating a SOI material comprising a top Si-containing layer having regions of various thickness. FIG. 1A illustrates an initial single-thickness SOI wafer that can be employed in the present invention. Specifically, the initial single-thickness SOI wafer of FIG. 1A comprises buried insulating region 12 that electrically isolates top Si-containing layer 14 from bottom Si-containing layer 10. The term "buried insulating region" is used herein to denote an insulator material which electrically isolates the top Si-containing layer from the bottom Si-containing layer. The buried insulator may include an oxide, a nitride, an oxynitride or any combination thereof. Moreover, the buried insulator region may be continuous, non-continuous or a mixture of continuous and non-continuous regions. Preferably, buried insulating region 12 is a continuous buried oxide (BOX) region which is shown, for example, in FIG 1A. It is noted that the buried insulating region may have a substantially uniform thickness over the entire wafer. Additionally, top Si-containing layer 14 of the initial SOI wafer typically has a substantially uniform thickness over the entire wafer.

The term "Si-containing" is used throughout the instant application to denote a layer that includes silicon. Illustrative examples of Si-containing materials include, but are not limited to: Si, SiGe, SiC, SiGeC, Si/Si, Si/SiGe, Si/SiC, and Si/SiGeC.

The SOI material may be formed utilizing conventional SIMOX (separation by ion implantation of oxygen) processes well known to those skilled in the art, as well as the various SIMOX processes mentioned in co-assigned U.S. patent applications Ser. Nos. 09/861,593, filed May 21, 2001, now U.S. Pat. No. 6,486,037; Ser. No. 09/861,594, filed May 21, 2001, now U.S. Pat. No. 6,602,757; Ser. No. 09/861,590, filed May 21, 2001; Ser. No. 09/861,596, filed May 21, 2001, now U.S. Pat. No. 6,541,356; and Ser. No. 09/884,670, filed Jun. 19, 2001 as well as U.S. Pat. No. 5,930,634 to Sadana, et al., the entire contents of each are incorporated herein by reference.

Alternatively, the SOI material may be made using other conventional processes including, for example, a thermal bonding and cutting process. The initial substrate shown in FIG. 1A may also be made using conventional deposition processes as well as lithography and etching (employed when fabricating a patterned substrate).

The thickness of the various layers of the initial structure may vary depending on the process used in making the same. Typically, however, buried insulating region 12 has a thickness of from about 1 to about 1000 nm, with a thickness of from about 20 to about 200 nm being more highly preferred. In the case of top Si-containing layer 14, Si-containing layer 14 typically has a thickness of from about 5 to about 2000 nm, with a thickness of from about 20 to about 1000 nm being more highly preferred. The thickness of the bottom Si-containing layer, i.e., layer 10, is inconsequential to the present invention. It is noted that the thicknesses provided above are exemplary and by no ways limit the scope of the present invention.

Figure 1B:
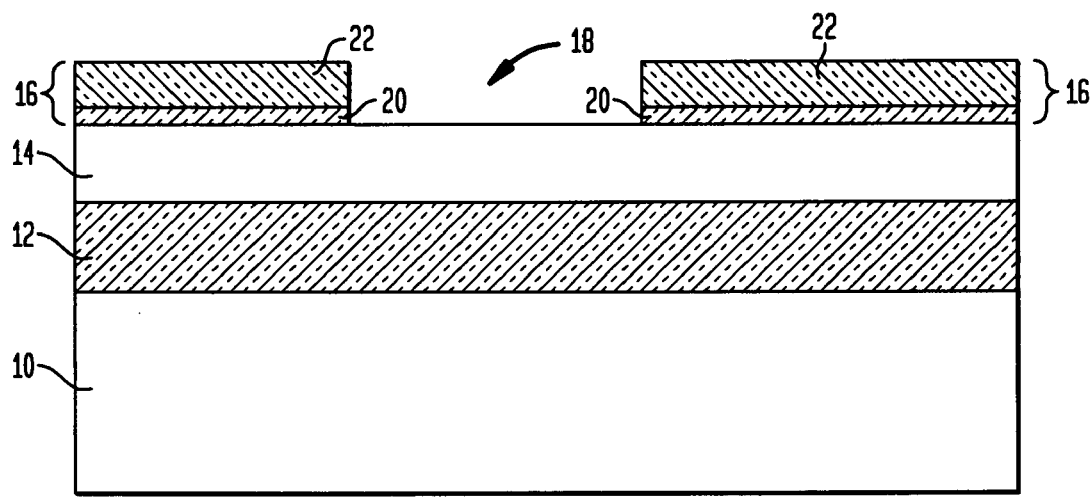

A patterned oxidation mask (labeled by reference numeral 16) is the formed on Si-containing layer 14 to provide the structure shown, for example, in FIG. 1B. Conventional deposition or thermal growing followed by lithography and etching are used in forming the structure shown in FIG. 1B. Note that the patterned oxidation mask includes at least one opening 18 that exposes portions of Si-containing layer 14. The patterned oxidation mask may be comprised of one or more materials selected from an oxide, a nitride or an oxynitride. In the drawing, patterned oxidation mask 16 comprises oxide layer 20 and SiN layer 22.

In the embodiment illustrated, oxide layer 20 is either deposited via a conventional deposition process such as chemical vapor deposition (CVD), plasma-assisted CVD, evaporation or chemical solution deposition, or thermally grown via oxidation onto the surface of Si-containing layer 14. The thickness of oxide layer 20 may vary, but typically oxide layer 20 has a thickness of from about 1 to about 20 nm.

After oxide layer has been formed atop Si-containing layer 14, SiN layer 22 is formed via a conventional deposition process atop oxide layer 20. The thickness of SiN layer 22 may also vary, but typically SiN layer 22 has a thickness of from about 5 to about 200 nm. The stack of SiN layer 22 and oxide layer 20 is then patterned by conventional lithography which includes, for example, applying a resist to SiN layer 22, exposing the resist to a pattern of radiation and developing the pattern into the exposed resist using a conventional resist developer. The pattern in the exposed resist is then transferred into SiN layer 22 utilizing an etching process including for example, reactive-ion etching (RIE), plasma etching, ion beam etching or laser ablation. After the pattern has been transferred into SiN layer 22, the patterned resist is removed from the structure utilizing a conventional resist stripping process and thereafter the pattern is transferred from the nitride layer into oxide layer 20 by one of the above-mentioned etching processes.

Figure 1C:
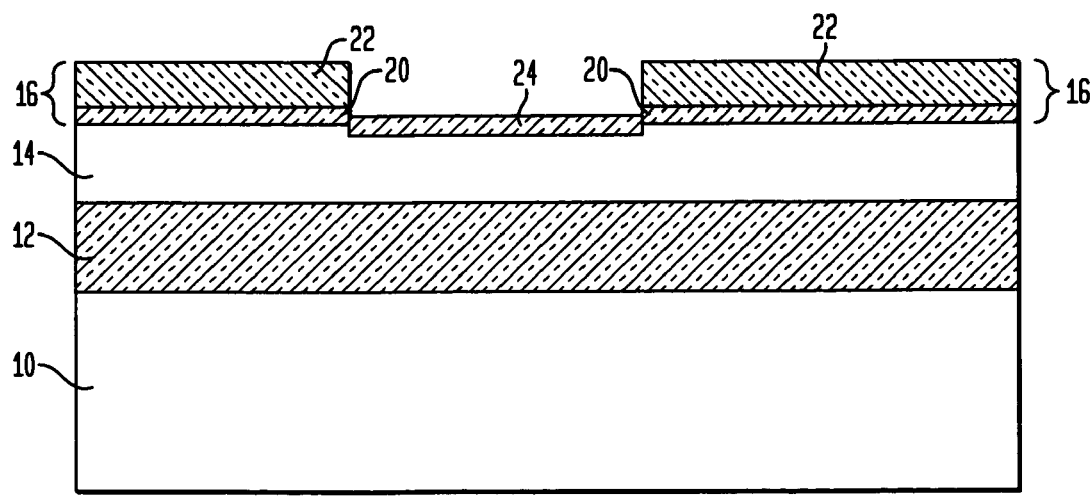

FIG. 1C shows the next processing step of the present invention where the exposed portions of Si-containing layer 14 not containing oxidation mask 16 are thinned by thermally growing oxide region 24 in the exposed silicon layer. Specifically, thermally grown oxide region 24 is formed by subjecting the structure shown in FIG. 1B to an oxidizing ambient such as air, ozone, steam, and other like oxygen-containing ambients, at a temperature of about 600° C. or greater for a time period of about 5 seconds or greater. More specifically, thermal oxide region 24 is grown at a temperature of from about 800° to about 1200° C. for a time period of from about 20 to about 4000 seconds. Note that the broad ranges mentioned above include rapid thermal oxidation conditions also well as furnace oxidation conditions.

As stated above, the growth of thermal oxide region 24 serves to thin the exposed regions of Si-containing layer 14. The amount of thinning may vary depending on the conditions used in forming thermal oxide region 24. Typically, the amount of silicon consumed, i.e., thinned, is approximately equal to ½ of the thermally grown oxide region.

Figure 1D:
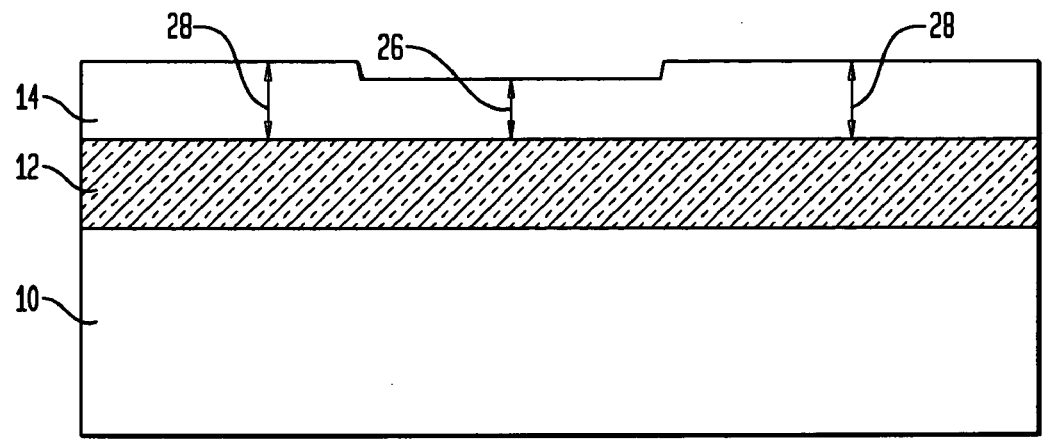

FIG. 1D shows the resultant structure that is formed after patterned oxidation mask 16 (including oxide layer 20 and SiN layer 22) as well as thermal grown oxide region 24 are removed from the structure shown in FIG. 1C. As shown, the structure illustrated has Si-containing layer 14 that has region 26 which is thinner than adjacent regions 28. The patterned oxidation mask and thermally grown oxide region are removed utilizing one or more etching steps that are highly selective in removing those materials from the structure. For example, phosphoric acid can be used in removing SiN layer 22, while hydrofluoric acid can be used in removing oxide layer 20 as well as thermally grown oxide 24.

Figure 1E:
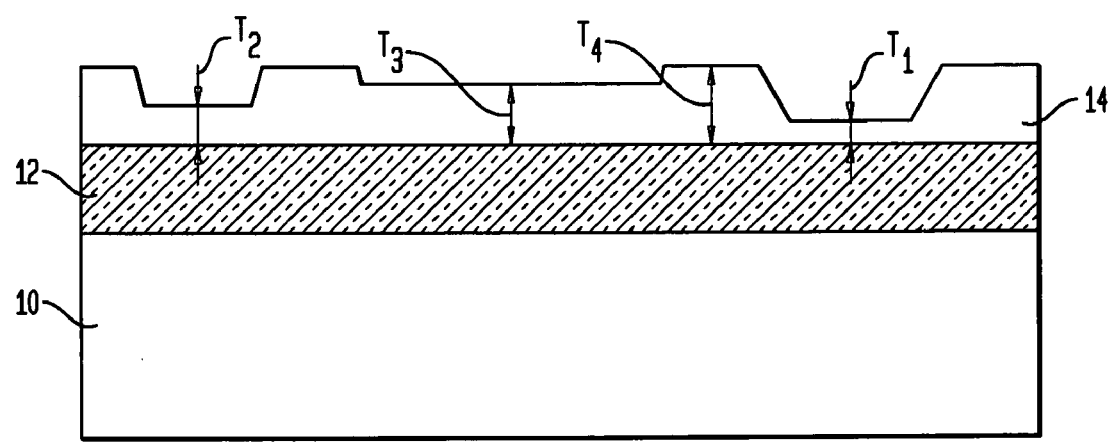

The above steps of forming a patterned oxidation mask, thinning by thermal oxidation and removal may be repeated any number of times to provide a SOI material comprising a top Si-containing layer having regions of various thickness. FIG. 1E illustrates a SOI material with Si-containing layer 14 having regions of four different thickness, $T_1, T_2, T_3$ and $T_4$, respectively. Note $T_1<T_2<T_3<T_4$. The SOI material illustrated in FIG. 1E is fabricated utilizing the method of the present invention.

The SOI material with multiple Si thickness can be used to build IC chips such that the various kinds of silicon devices on the chip have their own optimum, silicon thickness.

FIGS. 2A–2F illustrate the integration of SOI CMOS devices, without device substrate contact, which are built upon a relatively thin silicon layer, and SOI CMOS devices with device substrate contact, which are built upon a relatively thicker silicon layer, on the same chip. For simplicity, the present invention outlines the fabrication of a thin-silicon n-channel device and a thick-silicon n-channel device on the same chip. Extensions of the process to include thin-silicon p-channel device and thick-silicon p-channel device on the same chip can be made in a straightforward manner following usual CMOS process sequences.

Figure 2A:
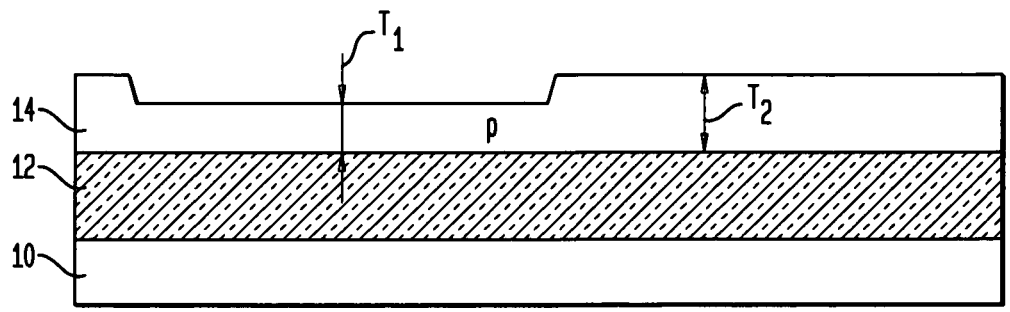
FIGS. 2A–2F are pictorial representations (through cross sectional views) illustrating the integration of thin-silicon and thick-silicon CMOS devices on the same IC chip.

FIG. 2A illustrates the starting SOI material with thin silicon regions $T_1$ and thick silicon regions $T_2$. Specifically, the initial SOI material includes bottom Si-containing layer 10, buried insulating region 12 and top Si-containing layer 14 which includes the regions of different silicon thickness. The starting SOI material is made using the inventive processing steps mentioned hereinabove.

Figure 2B:
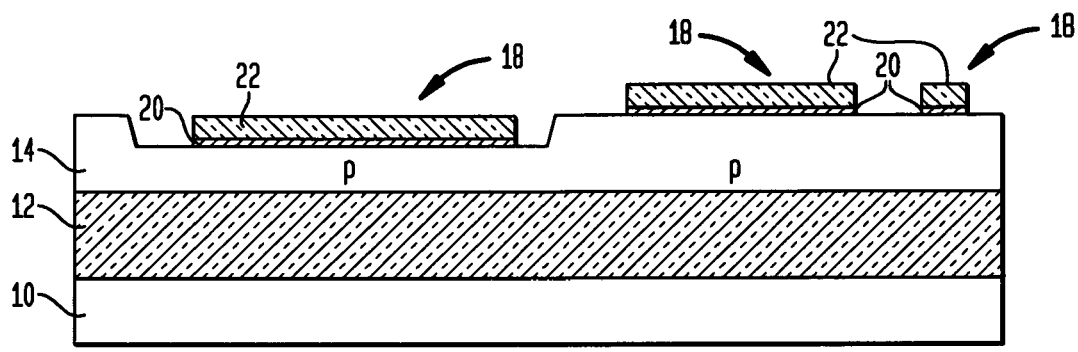

A plurality of patterned oxidation masks 16 which may include oxide layer 20 and SiN layer 22 are formed as described above on predetermined positions atop the structures shown in FIG. 2A to provide the structure shown, for example, in FIG. 2B.

The patterned oxidation masks are used at this point of the present invention to form isolation regions in the structure. Specifically, the areas of the previously thinned Si-containing layer 14 not containing the mask are oxidized using a conventional local oxidation of silicon process so as to form oxide isolation region 30. The resultant structure including oxide isolation regions 30 is shown, for example, in FIG. 2C.

It should be noted that if the thickness between the thickest silicon region and the thinnest silicon region is larger than the depth of field (DOF) of the lithographic tool used in IC fabrication, commonly used lithographic techniques such as planarization or top-surface imaging may have to be used in order to lithographically define the device patterns over the thin silicon and thick silicon simultaneously. The DOF of a lithographic tool is a function of the wavelength of the light source and the numerical aperture of the lens system. For most commonly used lithographic tools, the DOF is in the 500–1000 nm range.

Figure 2C:
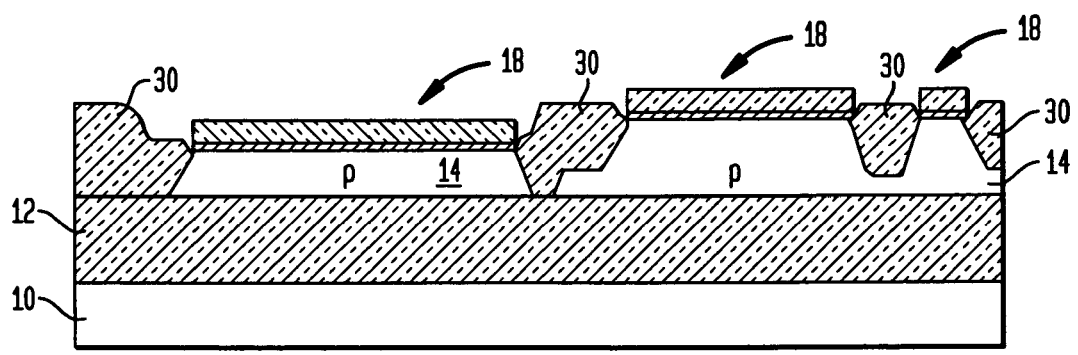
Figure 2D:
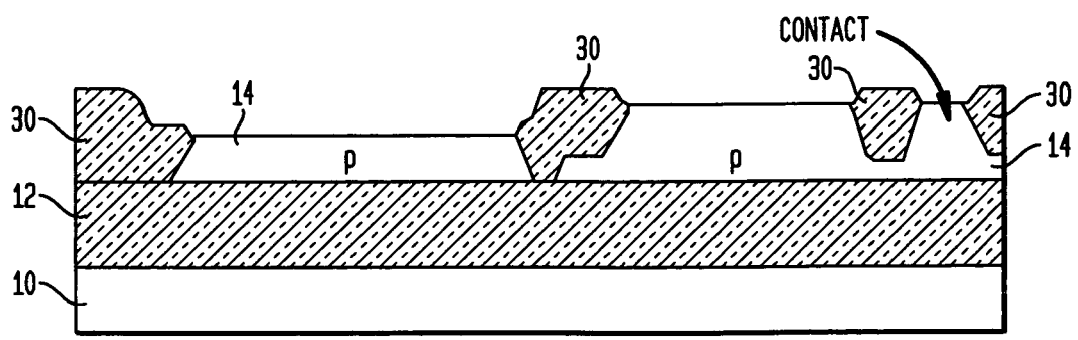

The patterned oxidation masks (including oxide layer 20 and SiN layer 22) are then removed from the structure shown in FIG. 2C to provide the structure illustrated in FIG. 2D. Specifically, the patterned oxidation mask is removed utilizing the etching steps mentioned hereinabove. In the embodiment depicted, the oxide isolation regions reach down to the buried insulating region of the SOI material in the thin silicon region, but not in the thick silicon region. This allows contact to the substrate of the thick-silicon device to be made readily, as indicated in FIG. 2D.

Figure 2E:
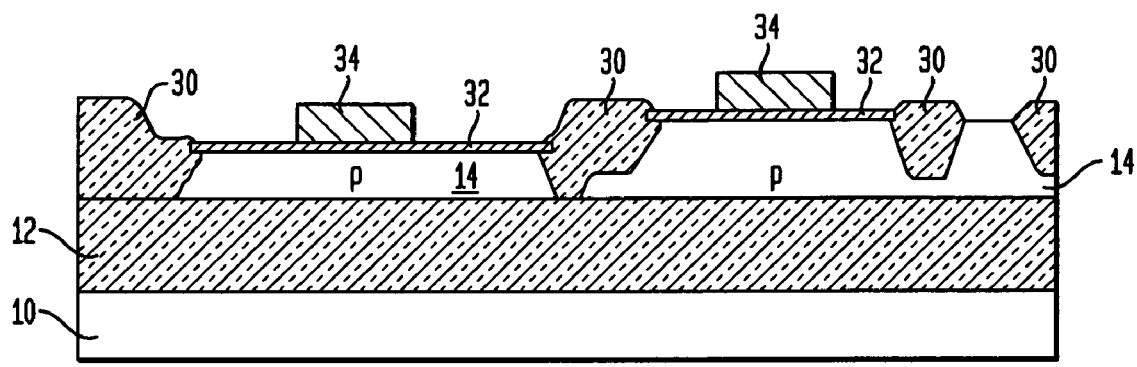

Gate dielectric 32 is then formed atop exposed regions of Si-containing layer 14 and thereafter a patterned gate region 34 is formed atop portions of gate dielectric 32 providing the structure shown, for example, in FIG. 2E.

The term "gate dielectric" is used in the present invention to denote any dielectric material including oxides, nitrides, oxynitrides or combinations thereof that have a dielectric constant of about 3.0 or greater. A preferred gate dielectric is an oxide such as, but not limited to: $SiO_2$, $Al_2O_3$, $Ta_2O_5$, $TiO_2$ and perovskite-type oxides. Gate dielectric 32 may be formed in the present invention by a conventional thermal growing technique, or alternatively, gate dielectric 32 may be formed by a deposition process. The thickness of gate dielectric 32 may vary, but typically gate dielectric 32 has a thickness of from about 1 to about 50 nm.

A conductive material such as polysilicon; a conductive metal (such as W, Pt, Cu, Al and the like); a silicide; or any combination thereof, is then formed atop the gate dielectric layer via a conventional deposition process and then patterned by lithography and etching to provide patterned gate region 34 atop portions of gate dielectric 32. A preferred-conductive material employed in the present-invention is polySi which is doped in-situ or by using conventional ion implantation and annealing.

In embodiments where patterned gate region 34 includes a stack of conductive material such as, for example, a stack comprising polySi and a conductive metal, an optional diffusion barrier layer is typically formed between the various conductive materials. The optional diffusion barrier layer is composed of any material which prevents metal from diffusing into the underlying polySi region during a subsequent high temperature annealing process.

Figure 2F:
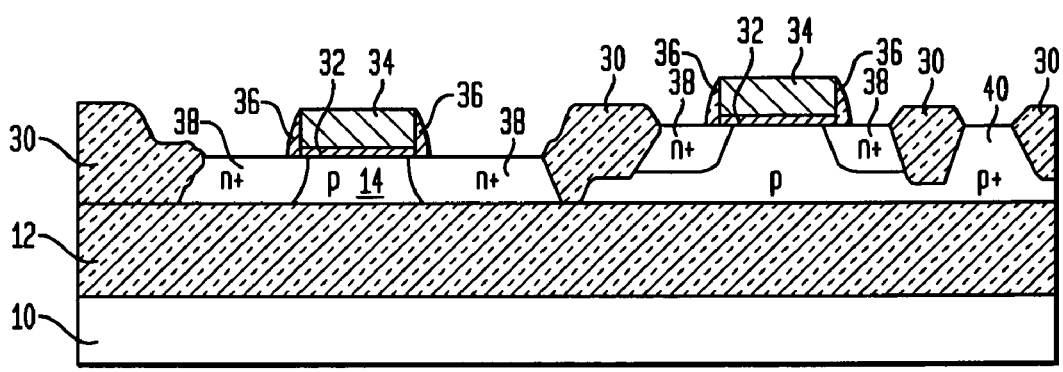

FIG. 2F shows the structure that is formed after formation of spacers 36, source/drain regions 38 and thick-silicon device substrate contact region 40 in the previously formed structure depicted in FIG. 2E. In accordance with the present invention, the source/drain regions and the thick-silicon device substrate contact region are formed by ion implantation followed by thermal annealing. The conditions of the ion implant and thermal anneal are conventional and well known to those skilled in the art.

Spacers 36 are formed in the present invention by first depositing an insulating material such as an oxide, nitride, oxynitride or any combination thereof on the structure and then etching the insulating material. The spacers formation may be conducted before, or after the formation of the source/drain regions and the thick-silicon device contact region. In some embodiments, as is shown, the gate dielectric is etched prior to spacer deposition. This embodiment is typically performed when the ion implantation step mentioned above is conducted prior to spacer formation. In other embodiments, not shown, the gate dielectric is not etched prior to spacer formation. In such an embodiment, the spacers would be formed atop the gate dielectric, instead of the Si-containing layer as is shown in FIG. 2F.

Standard processes for forming silicide contacts and interconnect wires can then by carried out on the structure shown in FIG. 2F to complete the IC fabrication.

In the embodiment illustrated in FIG. 2F, the CMOS device in the thin silicon region is a fully-depleted CMOS device having source and drain regions that are in contact with the buried insulating region and no quasi-neutral device substrate region, while the CMOS device in the thick-silicon region is partially depleted CMOS device having source and drain regions that are not in contact with the buried insulating region and a quasi-neutral device substrate region beneath the source and drain regions.

A semiconductor region is called quasi-neutral when its mobile carrier concentration is approximately at thermal equilibrium with its dopant concentration. For example, a p-type quasi-neutral region having a dopant concentration of $1\times10^{17}$ cm$^{-3}$ has a mobile hole concentration of approximately $1\times10^{17}$ cm$^{-3}$ at room temperature. The electric field in a quasi-neutral semiconductor region is approximately zero. An SOI CMOS device is called fully-depleted when the silicon layer underneath the gate region is thinner than the depletion region thickness so that the entire device body or substrate region (the p-type region underneath the gate in FIG. 2F) is depleted of mobile carriers. An SOI CMOS device is call partially depleted when the silicon layer underneath the gate region is thicker than the depletion region thickness so that only the device body or substrate immediately beneath the gate region is depleted of mobile carriers, while the device body or substrate between this depletion region and the buried oxide layer remains a quasi-neutral region.

In addition to the above embodiment, the present invention also contemplates the following structures which are not specifically shown, but would nevertheless be understood by those skilled in the art without a specific drawing:

An SOI IC chip including the inventive SOI material, a first type of fully depleted CMOS devices, which are built in relatively thinner regions of the top Si-containing layer, having source and drain regions in contact with the underlying buried insulating region and no quasi-neutral device substrate region, and a second type of partially depleted CMOS devices, which are built in relatively thicker silicon regions of the top Si-containing layer, having source and drain regions in contact with the underlying buried insulating region and having a quasi-neutral device substrate region.

An SOI IC chip including the inventive SOI material, a second type of partially depleted CMOS devices, which are built in relatively thicker silicon regions of the top Si-containing layer, having source and drain regions in contact with the underlying buried insulating region and having a quasi-neutral device substrate region, and a third type of partially depleted CMOS devices, which are built in relatively thicker silicon regions of the top Si-containing layer, having source and drain regions not in contact with the underlying buried insulating region and having a quasi-neutral device substrate region.

An SOI IC chip including the inventive SOI material, a first type of fully depleted CMOS devices, which are built in relatively thinner regions of the top Si-containing layer, having source and drain regions in contact with the underlying buried insulating region and no quasi-neutral device substrate region, a second type of partially depleted CMOS devices, which are built in relatively thicker silicon regions of the top Si-containing layer, having source and drain regions in contact with the underlying buried insulating region and having a quasi-neutral device substrate region, and a third type of partially depleted CMOS devices, which are built in relatively thicker silicon regions of the top Si-containing layer, having source and drain regions not in contact with the underlying buried insulating region and having a quasi-neutral device substrate region.

FIGS. 3A–3J illustrate an embodiment of the present invention where the integration of vertical npn bipolar transistors with CMOS devices on the same SOI chip has been carried out. In the present embodiment, the CMOS devices are assumed to be designed for high-speed digital or radio-frequency (RF) applications, and hence use relatively thin silicon layers. Note that the present invention is not limited to forming vertical npn transistors. Instead, pnp vertical bipolar transistors, and lateral bipolar transistors are also contemplated.

The bipolar transistors, on the other hand, require thicker silicon to accommodate the vertically stacked collector, base, and emitter regions. For simplicity, the fabrication of an n-channel is shown. However, extension of the embodiment to include a p-channel device, needed for building CMOS circuits, can be made in a straightforward manner. Also, the vertical npn bipolar transistor is assumed to have an advanced device structure, having a self-aligned polysilicon base contact and a polysilicon emitter. This advanced bipolar design is commonly used for high-speed applications. Modification of the process outlined in FIGS. 3A–3J for integrating less advanced bipolar transistors with CMOS devices is also straightforward.

In the integration of CMOS devices with vertical bipolar transistors, many process sequences can be used. In general, one can either more-or-less complete the CMOS devices first before fabricating the bipolar transistors. Alternatively, one can more-or-less complete the bipolar transistors first before fabricating the CMOS devices. In the embodiment illustrated, the process in which the CMOS devices are added after the bipolar transistors are more-or-less fabricated is shown.

Figure 3A:
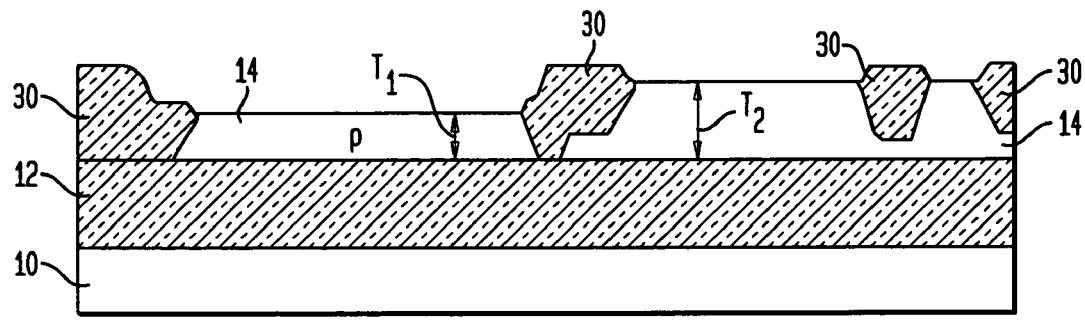
FIGS. 3A–3J are pictorial representations (through cross sectional views) illustrating the integration of CMOS devices and vertical npn bipolar transistors on the same IC chip.

The starting SOI wafer used in this embodiment of the present invention is shown in FIG. 3A. Specifically, the starting SOI wafer, which is fabricated using the processing steps of the present invention, comprises bottom Si-containing layer 10, buried insulating region 12 and top Si-containing layer 14 which includes regions of different thickness. In the drawing, $T_1$ is a thin-silicon region for fabricating an n-channel MSOFET, while $T_2$ is a thick-silicon region for fabricating a bipolar device.

The structure shown in FIG. 3A also includes oxide isolation regions 30 which are formed into Si-containing layer 14 as described above. The oxide isolation regions reach down to buried insulating region 12 in the thin-silicon region, but not in the thick-silicon region.

Figure 3B:
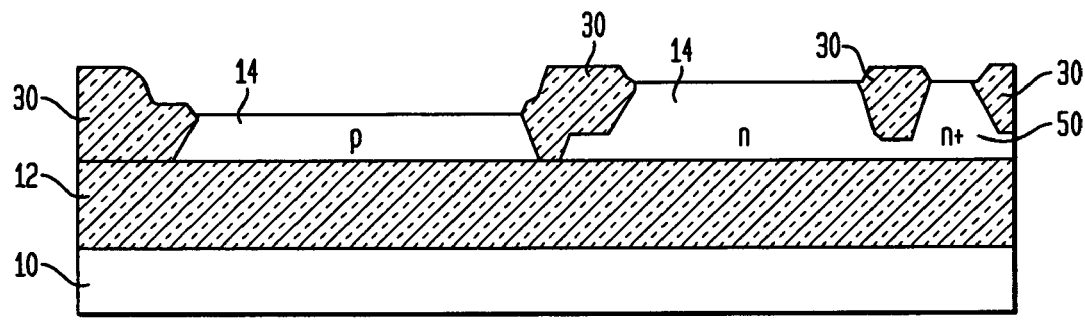

FIG. 3B shows the resultant structure that is obtained after collector-reach through 50 is formed into portions of Si-containing layer 14. The collector-reach through is formed by ion implanting either a p-type or n-type dopant into portions of Si-containing layer 14. In the embodiment illustrated, the collector-reach through is a heavily n-type dopant region.

Gate dielectric 32 is then formed on the structure using either a conventional deposition or thermal growing process and then polysilicon layer 54 is deposited. Polysilicon layer 54 is a thin layer having a thickness of from about 2 to about 50 nm. Polysilicon layer 54 is employed for protecting portions of the previously formed gate dielectric. The polysilicon layer and the gate dielectric is then removed in the region where the bipolar transistor is to be built, i.e., $T_2$, providing the structure shown, for example, in FIG. 3C. Specifically, the protective polysilicon layer and gate dielectric is removed from the bipolar transistor region by applying a resist (not shown) to the deposited protective polysilicon layer, patterning the resist via lithography such that the patterned mask protects at least the material formed in the CMOS device region, i.e., $T_1$, and then etching the exposed polysilicon and the underlying gate dielectric in the bipolar transistor region. After etching the patterned resist is removed utilizing a conventional stripping process.

Figure 3C:
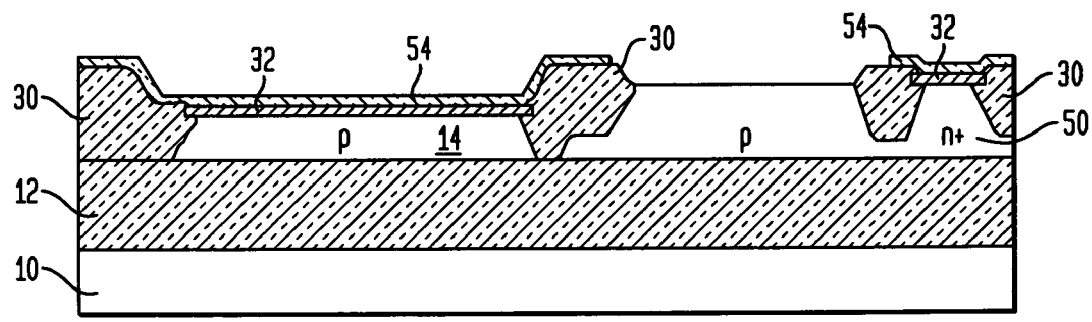
Figure 3D:
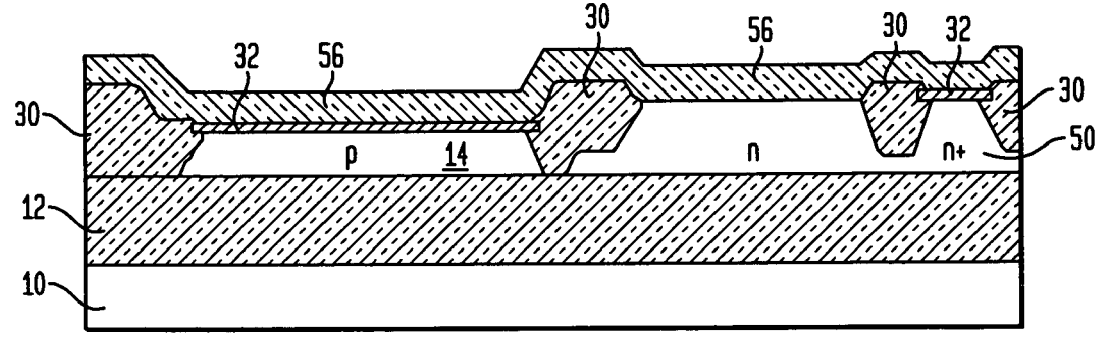
Figure 3E:
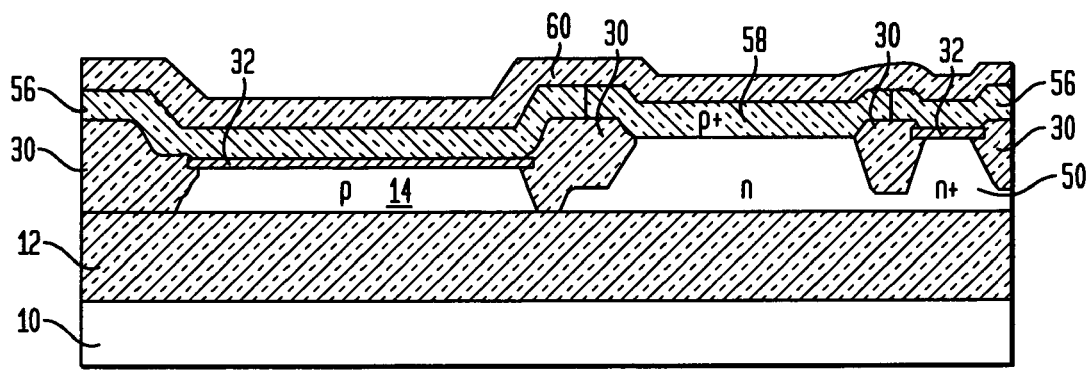

A second polysilicon layer (labeled as 56) is then formed via a conventional deposition process atop the structure shown in FIG. 3C providing the resultant structure illustrated in FIG. 3D. Note that in the CMOS device region poly Si layer 56 includes thin polysilicon layer 54 as well. Second polysilicon layer 56 is thicker than protective polysilicon layer 54. Typically, second polysilicon layer 56 has a thickness of from about 50 to about 200 nm. It is noted that in the CMOS device region the second polysilicon layer and the protective polysilicon layer form the gate polysilicon layer of the CMOS devices.

The polysilicon layer 56 in the bipolar device regions is then heavily doped either n- or p-type using conventional ion implantation. In the embodiment exemplified, the polysilicon in the bipolar transistor regions is heavily doped p-type using, for example, boron ions as the dopant species so as to provide p+ polysilicon region 58 for base contact. Oxide layer 60 is then deposited atop the polysilicon layer providing the structure shown, for example, in FIG. 3E.

Figure 3F:
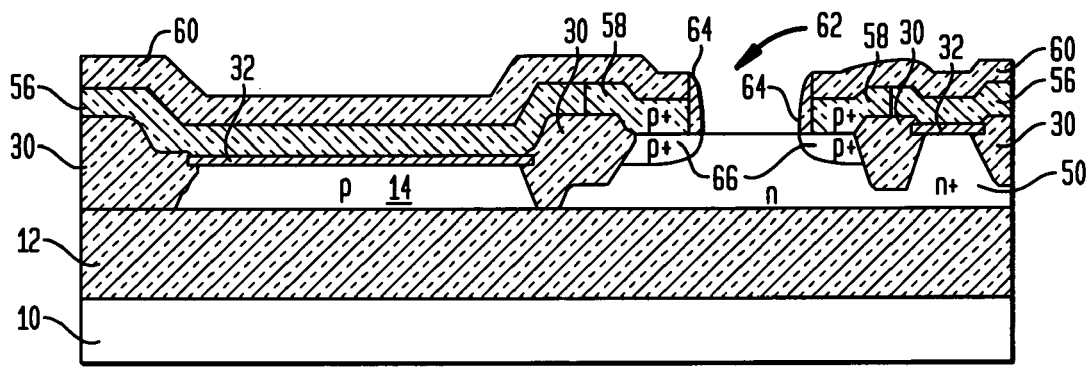
Figure 3G:
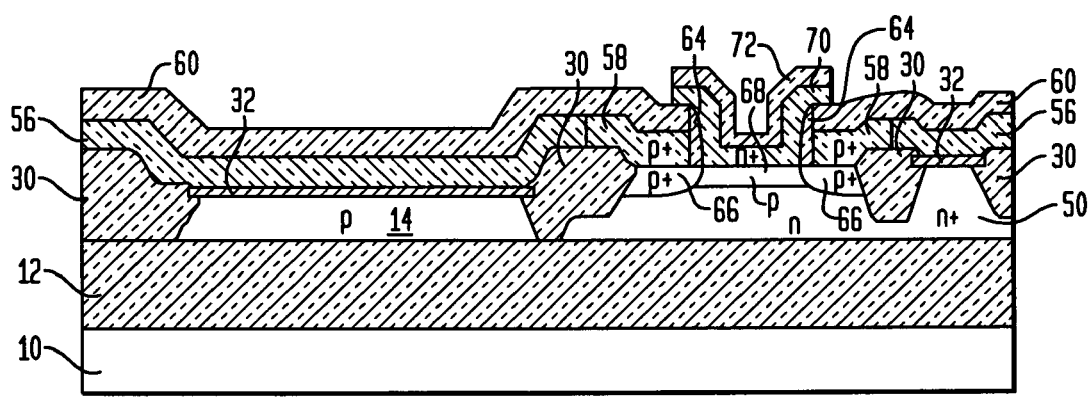
Figure 3H:
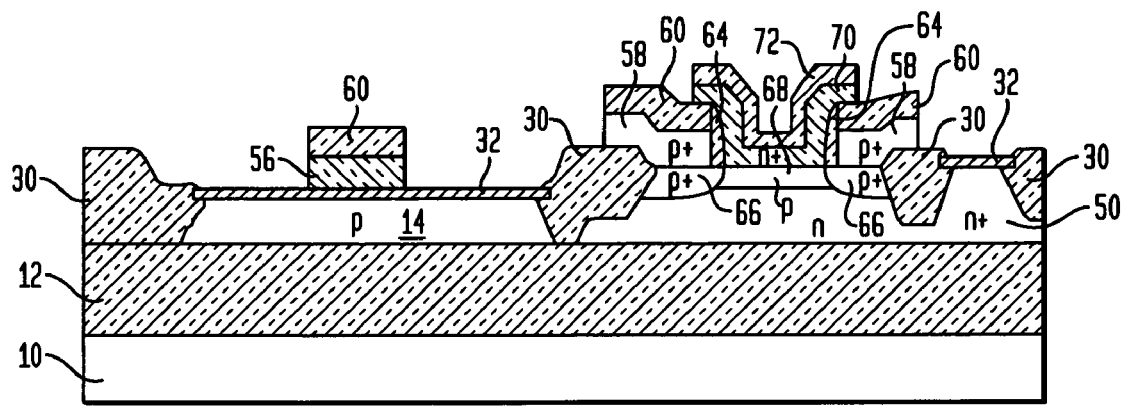

The oxide and polysilicon layers in the bipolar device regions are then etched to open emitter window 62. An oxide layer is then deposited and etched by anisotropic reactive ion etching to form oxide sidewalls 64 on the etched base polysilicon vertical surface. A thermal annealing step using conventional anneal conditions is then used to drive the boron from the p+ polysilicon region into underlying Si-containing layer 14 completing the formation of extrinsic base regions 66 of the bipolar transistor. The resultant structure including the above is shown in FIG. 3F.

P-type intrinsic base region 68 is now formed by implantation of boron. Emitter 70 is then formed by deposition of a layer of polysilicon which is doped heavily n-type either by ion implantation or in-situ doping during the polysilicon deposition. An oxide layer is formed on the emitter polysilicon layer via a conventional deposition or thermal growing process. The oxide and polysilicon layers are patterned to form emitter 70 which has oxide layer 72 located thereon. The resultant structure that is formed after these steps, which complete the formation of the npn bipolar transistor, is shown, for example, in FIG. 3G.

To proceed with the fabrication of the CMOS devices, the gate polysilicon layer, i.e., layer 56, which also forms the base of the emitter, is patterned using conventional patterning techniques that are well known to those skilled in the art. The structure including the patterned CMOS device regions is shown, for example, in FIG. 3H.

Figure 3I:
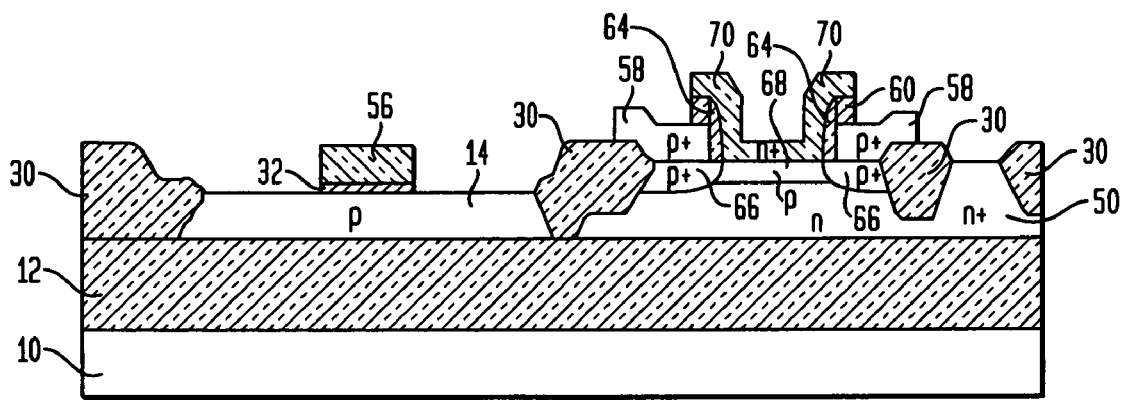
Figure 3J:
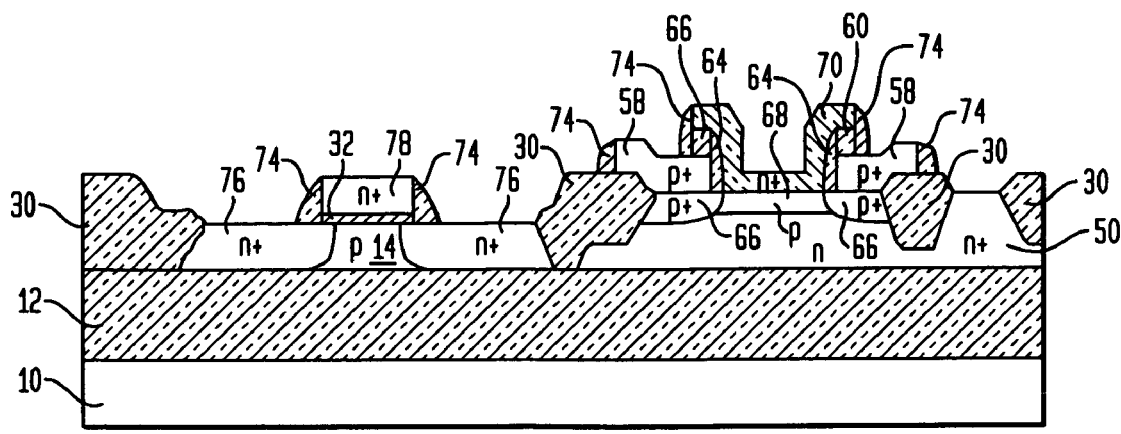

A blanket oxide removal step is then performed providing the structure illustrated in FIG. 3I. Specifically, a reactive-ion etching step that is highly selective in removing oxide is employed. Note that in the CMOS device regions Si-containing layer 14 and gate polysilicon are left exposed, while in the bipolar transistor device regions the emitter polysilicon is left exposed.

An oxide is deposited and etched to form oxide spacers 74 on all vertical polysilicon surfaces. The source, drain and gate polysilicon of the n-channel device is then formed by ion implantation, using an implantation mask to protect the bipolar transistor region during the ion implantation step. The resultant structure, including source/drain regions 76 and doped gate polysilicon 78, is shown, for example, in FIG. 3I. The above step completes the formation of the n-channel device.

Standard processes for fabricating silicide and interconnect wires can then be carried out to complete the IC chip fabrication.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

The invention claimed is:

1. A method of forming a semiconductor structure comprising:
    providing a starting SOI wafer which comprises a buried insulating region sandwiched between a bottom Si-containing layer and a top Si-containing layer, said top Si-containing layer having a substantially uniform thickness;
    thinning predetermined regions of the top Si-containing layer by masked oxidation of silicon to provide at least a first region within said top Si-containing layer having a first thickness and at least a second region having a second thickness, where said first thickness is different from said second thickness;
    forming a fully depleted CMOS device in said first region having source and drain regions in contact with the underlying buried insulating region; and
    forming a partially depleted CMOS device in said second region having a quasi-neutral device substrate region.

2. The method of claim 1 wherein said thinning comprises the steps of forming patterned oxidation masks on predetermined regions of said SOI wafer and oxidizing exposed portions of said SOI wafer.

3. The method of claim 2 wherein said oxidation is performed at a temperature of 600° C. or greater for a time period of about 20 seconds or greater.

4. The method of claim 1 wherein said partially depleted CMOS device has source and drain regions that are in contact with said underlying buried insulating region.

5. The method of claim 1 wherein said fully depleted CMOS device has a quasi-neutral device substrate region.

6. The method of claim 1 wherein said partially depleted device has source and drain regions that are not in contact with said underlying buried insulating region.

7. A method of forming a semiconductor structure comprising:
    providing a starting SOI wafer which comprises a buried insulating region sandwiched between a bottom Si-containing layer and a top Si-containing layer, said top Si-containing layer having a substantially uniform thickness;
    thinning predetermined regions of the top Si-containing layer by masked oxidation of silicon to provide at least a first region within said top Si-containing layer having a first thickness and at least a second region having a second thickness, where said first thickness is different from said second thickness;
    forming a fully depleted CMOS device in said first region of the top Si-containing layer having source and drain regions in contact with the underlying buried insulating region and no quasi-neutral device substrate region;
    forming a first partially depleted CMOS device in said second region of the top Si-containing layer having source and drain regions in contact with the underlying buried insulating region and having a quasi-neutral device substrate region; and
    forming a second partially depleted CMOS device located in a relatively thicker silicon region of the top Si-containing layer having source and drain regions not in contact with the underlying buried insulating region and having a quasi-neutral device substrate region.

8. A method of forming a semiconductor structure comprising:
    providing a starting SOI wafer which comprises a buried insulating region sandwiched between a bottom Si-containing layer and a top Si-containing layer, said top Si-containing layer having a substantially uniform thickness;
    thinning predetermined regions of the top Si-containing layer by masked oxidation of silicon to provide at least a first region within said top Si-containing layer having a first thickness and at least a second region having a second thickness, where said first thickness is different from said second thickness;
    forming a CMOS device in said first region; and
    forming a bipolar device in said second region, said bipolar device is a vertical transistor including a collector, a base and an emitter.

* * * * *